United States Patent
Yamada (10) Patent No.: US 8,044,304 B2
(45) Date of Patent: Oct. 25, 2011

(54) MULTILAYER PRINTED CIRCUIT BOARD

(75) Inventor: Shingetsu Yamada, Nagahama (JP)

(73) Assignee: Mitsubishi Plastics, Inc., Tokyo (JP)

( * ) Notice: Subject to any disclaimer, the term of this patent is extended or adjusted under 35 U.S.C. 154(b) by 1127 days.

(21) Appl. No.: 11/814,531

(22) PCT Filed: Jan. 24, 2006

(86) PCT No.: PCT/JP2006/301000
§ 371 (c)(1),
(2), (4) Date: Jul. 23, 2007

(87) PCT Pub. No.: WO2006/078027
PCT Pub. Date: Jul. 27, 2006

(65) Prior Publication Data
US 2009/0020319 A1    Jan. 22, 2009

(30) Foreign Application Priority Data
Jan. 24, 2005    (JP) ................... 2005-015352

(51) Int. Cl.
*H05K 1/00* (2006.01)
(52) U.S. Cl. ...................... 174/258; 361/792
(58) Field of Classification Search .......... 174/258; 361/792–795
See application file for complete search history.

(56) References Cited

U.S. PATENT DOCUMENTS

| | | | | |
|---|---|---|---|---|
| 6,010,769 A | * | 1/2000 | Sasaoka et al. | 428/209 |
| 2003/0178726 A1 | | 9/2003 | Ogawa et al. | |
| 2004/0062019 A1 | * | 4/2004 | Akama | 361/792 |
| 2004/0156583 A1 | * | 8/2004 | Totani et al. | 385/24 |

FOREIGN PATENT DOCUMENTS

| | | |
|---|---|---|
| JP | H7-176846 | 7/1995 |
| JP | 8-181450 A | 7/1996 |
| JP | 2000-200976 A | 7/2000 |
| JP | 2002-252465 A | 9/2002 |
| JP | 3514647 | 1/2004 |

OTHER PUBLICATIONS

Ryo Enomoto, "All Layer IVH Printed Wiring Board Using Single Step Laminating Process", Electronics Packaging Academic Journal, Japan Institute of Electronic Packaging, Nov. 2000, vol. 3(7),pp. 544-547.
Shuji Maeda et al., "A New Material for Simultaneous Multi-Layer and Lamination Process with any Layer IVH", MES 2004 14th Microelectronics Symposium Collected Papers, Japan Institute of Electronics Packaging, Oct. 14, 2004, pp. 341-344.

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A multilayer printed circuit board is characterized in that circuit boards 1 and 2 and a circuit board 3 are laminated alternately to form a multilayer body using a simultaneous lamination method, the circuit boards 1 and 2 including a film-, thin plate-, or sheet-like insulating substrate 11 made of a thermosetting resin containing any one of epoxy resin, bismaleimide/triazine resin, and allylic polyphenylene ether resin as a major component, the circuit board 3 including a film-, thin plate-, or sheet-like insulating substrate 21 made of a thermoplastic resin containing a polyaryl ketone resin and amorphous polyether imide resin having a crystal-fusing peak temperature of 260° C. or more. By the present invention, it is possible to provide a multilayer printed circuit board which has small fusion or flow deformation at the time of simultaneous lamination, which does not have unevenness in positional precision in the lamination direction, which has no need for the processes to be readjusted, and which has high reliability in interlayer electrical connection.

8 Claims, 10 Drawing Sheets

MULTILAYER PRINTED CIRCUIT BOARD

TECHNICAL FIELD

The present invention relates to a multilayer printed circuit board, and more particularly, to a multilayer printed circuit board in which a printed circuit board made of a thermosetting resin as a major component and a printed circuit board made of a thermoplastic resin as a major component coexist and are laminated without any adhesive layer interposed therebetween.

CROSS-REFERENCE TO PRIOR APPLICATION

This is a U.S. National Phase Application under 35 U.S.C. §371 of International Patent Application No. PCT/JP2006/301000 filed Jan. 24, 2006, and claims the benefit of Japanese Patent Application No. 2005-015352, filed Jan. 24, 2005, both of which are incorporated by reference herein. The International Application was published in Japanese on Jul. 27, 2006 as WO 2006/078027 A1 under PCT Article 21(2).

BACKGROUND ART

In recent years, with the decrease in size and enhancement in performance of electronic apparatuses and the increase in variety and the decrease in price of products, a decrease in cost of multilayer circuit boards with a high density, or a simplification of part mounting technologies and manufacturing technologies has been required for printed circuit boards mounted thereon.

The build-up multilayer printed circuit board made by International Business Machines (IBM) Corporation was suggested as a multilayer circuit board with a high density.

The build-up multilayer printed circuit board has a configuration such that a build-up layer capable of being finely wired is stacked one by one on a core substrate and has been used in various electronic apparatuses, since it can be wired relatively finely in comparison with conventional circuit boards.

As the decrease in size and the enhancement in performance of electronic apparatuses and the increase in variety of products further advances, a variety of requirements such as an increase in the number of build-up layers, an introduction of a stacked via structure, a decrease in diameter of a through-hole formed in a core substrate, a decrease in pitch between the through-holes, and a decrease in board thickness have been desired to the build-up multilayer circuit board.

However, in the build-up multilayer circuit board, the processes required to realize the increase in the number of build-up layers, the stacked via structure, and the like, are complicated and thus the manufacturing cost thereof increases, thereby increasing the price thereof.

Therefore, in order to solve the above-mentioned problems, there has been suggested a multilayer printed circuit board with an all-layer IVH structure which has a high degree of freedom in wiring design, which can realize a stacked via structure, and which is suitable for high-speed signal transmission (for example, see Patent Document 1).

The multilayer circuit board is the above mentioned multilayer circuit board having a 4-layer inner via-hole structure and uses as a wiring substrate a sheet substrate member (prepreg) in which an epoxy resin as a thermosetting resin is impregnated in aramid nonwoven fabric.

The multilayer circuit board is manufactured using a via forming method for prepreg.

A through-hole is first formed in a sheet substrate member, and the through-hole is then filled with conductive paste containing metal particles and dried and hardened. Then, the conductive paste is hardened by thermally pressing a copper foil on both surfaces thereof, thereby forming a double-sided copper panel. A double-sided circuit board is formed in which circuit patterns are formed on both surfaces thereof by etching the double-sided copper panel. Next, by disposing the sheet substrate member on both surfaces of the double-sided circuit substrate, disposing a copper foil outside of the sheet substrate members, and then thermally pressing them, the 4-layer inner via-hole structure is formed.

There has also been suggested a multilayer circuit board having an all-layer IVH structure which can be multilayered by a simultaneous lamination method (for example, see Non-patent Document 1).

The multilayer circuit board is an all-layer IVH circuit board which can be obtained by the simultaneous lamination method. The multilayer circuit board can be obtained by preparing a single-sided circuit board having wiring patterns and via-holes in each layer using a single-sided rigid copper lamination panel formed of a glass cross epoxy substrate, applying an adhesive made of a thermosetting resin to the surface of the single-sided circuit board opposite to the surface having the wiring patterns formed thereon, and then simultaneously laminating a plurality of single-sided circuit boards to which the adhesive is applied.

The simultaneous lamination method has the following features. A stacked via structure or a pad-on-via structure can be easily realized, and the diameter of via lands can be decreased because the via position hardly varies at the time of the simultaneous lamination in comparison with a method of performing a via process to the prepreg. In addition, it is possible to obtain a high yield by simultaneously laminating only the boards having no defect. Furthermore, the process is very simple and the manufacturing time can be greatly reduced by manufacturing the layers in parallel to each other.

As a simultaneous lamination method, there has been suggested a method different from the above-mentioned simultaneous lamination method (for example, see Non-patent Document 2).

In the simultaneous lamination method, a plurality of copper laminated panels in which an adhesive layer using a thermosetting resin as a base and a previously prepared cover film are attached to a surface opposite to a copper surface of a single-sided copper laminated panel made of a thermosetting resin are prepared, desired circuit patterns are formed on the copper surfaces of the single-sided copper laminated panels by etching, vias are formed on the single-sided copper laminated panels out of conductive paste, the cover films are removed from the single-sided copper laminated panels, and then the single-sided copper laminated panels are simultaneously laminated.

There has been suggested a multilayer circuit board having an all-layer IVH structure which can be multilayered by a simultaneous lamination method not using an adhesive (for example, see Patent Document 2).

The multilayer circuit board includes an insulating substrate made of a thermoplastic resin containing polyaryl ketone and polyether imide. In the simultaneous lamination method, the multilayer circuit board is manufactured by setting the insulating substrate before the simultaneous lamination in an amorphous state, simultaneously laminating the insulating substrates at a temperature higher than the glass transition temperature of the thermoplastic resin so as to cause a thermal fusion between the layers, and then additionally crystallizing the layers.

[Patent Document 1] Japanese Unexamined Patent Publication No. 7-176846
[Patent Document 2] Japanese Patent No. 3514647
[Non-Patent Document 1] Akira ENOMOTO, "All Layer IVH Printed Wiring Board Using Single Step Laminating Process", Electronics Packaging Academic Journal, Japan Institute of Electronic Packaging., November of 2000, vol. 3 (7), P544-547
[Non-Patent Literature 2] Shuji MAEDA and three others, "Simultaneous Multilayer Circuit Board Material and Corresponding Process", MES2004 14-th Microelectronics Symposium Collected Papers, Japan Institute of Electronics Packaging., October 14 of Heisei 16, P341-344

DISCLOSURE OF THE INVENTION

Problems to be Solved by the Invention

Since the conventional via forming method for prepreg is the same sequential method as the build-up method and a single material such as prepreg is made to function as an interlayer insulating layer and an adhesive layer, fusion or flow deformation at the time of forming a multilayer increases, positional precision in the lamination direction is uneven, positional precision of the via is not sufficient, and thus it is difficult to reduce the diameter of a via land.

Therefore, it is difficult to use the multilayer circuit board having the 4-layered inner via-hole structure using the via forming method as a mother board or a module substrate which is wired with a high density.

In the multilayer circuit board manufactured by the simultaneous lamination method, an adhesive made of a thermosetting resin is used to perform the simultaneous lamination, but it is difficult to control the flow and hardening characteristics of the adhesive in the simultaneous lamination process or a linear expansion coefficient in the Z direction of the board is uneven due to the interposition of the adhesive, thereby deteriorating reliability in interlayer electrical connection.

In the multilayer circuit board manufactured by the simultaneous lamination method not using an adhesive, since the thermoplastic resin containing polyaryl ketone and polyether imide is a new material for the insulating substrate, there is a problem in that the readjustment of processes is required for the simultaneous lamination or the part mounting.

The invention is made to solve the above-mentioned problems. An object of the invention is to provide a multilayer printed circuit board which has small fusion or flow deformation at the time of simultaneous lamination, has no unevenness in positional precision in the lamination direction, has no need for the processes to be readjusted, and has high reliability in interlayer electrical connection.

Means for Solving the Problems

As a result of research and development, the inventor made the invention by discovering that a multilayer printed circuit board having no deformation or no decrease in precision after the simultaneous lamination, having high reliability in interlayer electrical connection, and having high suitability for manufacturing processes can be realized when a circuit board containing a thermosetting resin as a major component and a circuit board containing a thermoplastic resin as a major component are made to coexist to form a multilayer body.

According to an aspect of the invention, there is provided a multilayer printed circuit board in which one or more first circuit boards formed of a first insulating substrate containing a thermosetting resin as a major component and one or more second circuit boards formed of a second insulating substrate containing a thermoplastic resin as a major component coexist to form a multilayer body.

In the multilayer printed circuit board, since one or more first circuit boards formed of a first insulating substrate containing a thermosetting resin as a major component and one or more second circuit boards formed of a second insulating substrate containing a thermoplastic resin as a major component coexist to form a multilayer body, the multilayer printed circuit board has excellent heat resistance, high mechanical strength, and excellent electrical insulating ability, fusion or flow deformation of the resin does not occur, and deterioration in positional precision of the wiring patterns or vias due to fusion or flow deformation of the resin does not occur, and thus making it possible to reduce the diameter of conductive wiring patterns and obtain via lands with high precision and accuracy. Accordingly, it is possible to provide a multilayer printed circuit board with high density and precision, excellent electrical characteristics and reliability.

The circuit boards can be diversified by suitably selecting the types or shapes of the thermosetting resin and the thermoplastic resin. Accordingly, it is possible to apply these circuit boards to various multilayer printed circuit boards by combining the various circuit boards.

By combining various wiring substrates, it is suitable for production of many types of models in stall quantities.

The first circuit board is preferably configured so that a conductive pattern is formed on at least one surface of the first insulating substrate and an interlayer wire penetrating the first insulating substrate in the thickness direction is formed in the first insulating substrate.

The second circuit board preferably includes one or both of circuit boards in which a conductive pattern is formed on at least one surface of the second insulating substrate and an interlayer wire penetrating the second insulating substrate in the thickness direction is formed in the second insulating substrate, and a circuit board in which only an interlayer wire penetrating the second insulating substrate in the thickness direction is formed in the second insulating substrate.

The interlayer wire is preferably made of conductive paste.

The circuit boards at both ends of the multilayer body in the lamination direction are preferably formed of the first circuit board.

The thermosetting resin preferably contains as a major component one selected from the group consisting of an epoxy resin, bismaleimide/triazine resin, and allylic polyphenylene ether resin.

The thermoplastic resin preferably contains a crystalline polyaryl ketone resin and amorphous polyether imide resin having a crystal-fusing peak temperature of 260° C. or more.

The content of the crystalline polyaryl ketone resin is preferably in the range of 30 wt % to 70 wt % and the balance preferably contains the amorphous polyether imide resin and inevitable impurities.

The crystalline polyaryl ketone resin is preferably a polyetherether ketone resin.

Effect of the Invention

In the multilayer printed circuit board according to the invention, since one or more first circuit boards formed of a first insulating substrate containing a thermosetting resin as a major component and one or more second circuit boards formed of a second insulating substrate containing a thermoplastic resin as a major component coexist to form a multilayer body, it is not necessary to provide an adhesive layer or a cover layer. Accordingly, since the multilayer printed circuit board has excellent heat resistance, high mechanical strength, and excellent electrical insulating ability and the dielectric constant thereof can be reduced, it is possible to cope with high frequencies.

Fusion or flow deformation of the resin does not occur and thus low-temperature welding is possible. Deterioration in positional precision of the wiring patterns or via due to the fusion or flow deformation of the resin does not occur, and thus it is possible to reduce the diameter of conductive wiring patterns and obtain via lands with high precision and accuracy.

Accordingly, it is possible to provide a multilayer printed circuit board with high density and precision, more over excellent electrical characteristics and reliability.

Further, is possible to easily cope with the diversification of the circuit boards by suitably selecting the types or shapes of the thermosetting resin and the thermoplastic resin. Accordingly, it is possible to cope with various multilayer printed circuit boards by combining the various circuit boards. Therefore, it is suitable for the production of many types of models in small quantities.

DESCRIPTION OF REFERENCE NUMERALS AND SIGNS 1, 2: (first) circuit board
3: (second) circuit board
11: (first) insulating substrate
11a: surface (main surface)
12: conductive pattern
13: via-hole
14: via wire (interlayer wire)
21: (second) insulating substrate
22: via-hole
31: copper (Cu) foil
32: through-hole
33: conductive paste
34: through-hole
41: laminating jig
42: cushion film
43: pressing jig
51, 52: (second) circuit board
61, 62: (second) circuit board
63: conductive pattern

BEST MODES FOR CARRYING OUT THE INVENTION

Multilayer printed circuit boards according to the best embodiments of the invention will be described below.

The embodiments are specific examples intended to allow the gist of the invention to be more easily understood and are not intended to limit the scope of the invention.

First Embodiment

Figure 1:
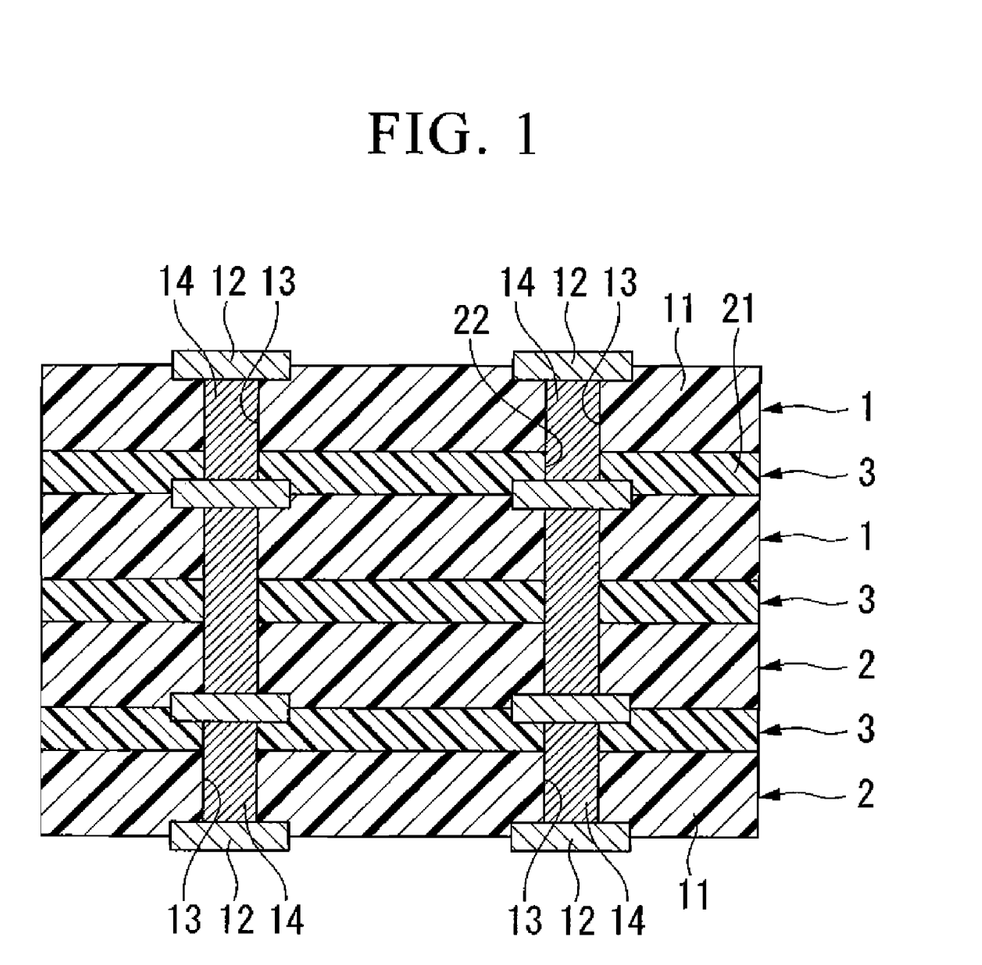
FIG. 1 is a cross-sectional view illustrating a multilayer printed circuit board according to a first embodiment of the invention.

FIG. 1 is a cross-sectional view illustrating a multilayer printed circuit board according to a first embodiment of the invention. In the figure, reference numerals 1 and 2 denote a (first) circuit board and reference numeral 3 denotes a (second) circuit board. The circuit boards 1 and 2, and the circuit board 3 are laminated alternately and form a multilayer body by a simultaneous laminating method.

In the circuit board 1, a conductive pattern 12 formed of a copper (Cu) foil with a thickness of 35 µm or less is formed on the top surface of the (first) insulating substrate 11 having a film, thin plate, or sheet shape with a thickness of 300 µm or less and containing a thermosetting resin as a major component, a plurality of via-holes 13 (two in the figure) penetrating the insulating substrate 11 in the thickness direction thereof are formed therein, and the conductive via wire (interlayer wire) 14 formed by hardening conductive paste is formed in the via-holes 13 and 13. The via wire 14 is electrically connected to the conductive pattern 12.

The circuit board 2 has the same configuration as the circuit board 1. In the circuit board 2, the conductive pattern 12 formed of a copper (Cu) foil with a thickness of 35 µm or less is formed on the bottom surface of the (first) insulating substrate 11 having a film, thin plate, or sheet shape with a thickness of 300 µm and containing a thermosetting resin as a major component, the plurality of via-holes 13 (two in the figure) penetrating the insulating substrate 11 in the thickness direction thereof are formed therein, and the conductive via wire (interlayer wire) 14 formed by hardening conductive paste is formed in the via-holes 13. The via wire 14 is electrically connected to the conductive pattern 12.

The thermosetting resin preferably contains one selected from the group consisting of an epoxy resin, bismaleimide/triazine resin, and allylic polyphenylene ether resin as a major component.

Specifically, the epoxy resin is desirable in view of adhesion property to a thermoplastic resin of a circuit board 3 to be described later.

The via wire 14 is obtained by heating and hardening conductive paste. An example of the conductive paste includes silver (Ag) paste, silver (Ag)-coated copper (Cu) paste, and copper (Cu) paste of a resin-based press contact type and resin-based solder paste of a metal diffusion type such as Sn/Ag/Cu.

In the circuit board 3, a plurality of via-holes 22 (two in the figure) penetrating (second) insulating substrate 21 in the thickness direction are formed in the insulating substrate 21 having a film, thin plate, or sheet shape with a thickness of 100 µm or less and containing a thermoplastic resin as a major component and the conductive via wire (interlayer wire) 14 formed by hardening conductive paste is formed in the via-holes 22. The via-holes 22 are disposed to correspond to the positions of the via-holes 13 of the circuit boards 2 and 3.

The thermoplastic resin preferably contains crystalline polyaryl ketone resin and amorphous polyether imide resin having a crystal-fusing peak temperature of 260° C. or more.

The crystalline polyaryl ketone resin is a thermoplastic resin containing an aromatic nuclear bond, an ether bond, and a ketone bond in its structural unit and the preferable examples thereof include polyether ketone, polyetherether ketone, and polyether ketone ketone. Among these, the polyetherether ketone resin is more preferable.

The polyetherether ketone resin is available on the market as "PEEK151G", "PEEK381G", and "PEEK450G" (all of which are trade names of VICTREX Co.).

The amorphous polyether imide resin is an amorphous thermoplastic resin containing an aromatic nuclear bond, an ether bond, and an imide bond in its structural unit and is not particularly limited. The polyether imide is available on the market as "Ultem CRS5001" and "Ultem 1000" (all of which are trade names of General Electric Co.).

In consideration of the adhesion property to the thermosetting resin of the circuit boards 2 and 3, the thermoplastic resin is preferably a resin composition which contains 30 wt % to 70 wt % of a crystalline polyaryl ketone resin having a melting peak temperature of 260° C. or more and the balance of polyether imide resin and inevitable impurities.

Here, the reason for defining the content of the crystalline polyaryl ketone resin to 30 wt % to 70 wt % is as follows. When the content is greater than 70 wt %, the crystallization ability increases and thus the lamination ability at the time of forming a multilayer deteriorates. When the content is less than 30 wt %, the crystallization ability of the whole composition decreases and thus the heat resistance of the reflow deteriorates even at the crystal-fusing peak temperature of 260° C. or more.

The reason for defining the balance (30 wt % to 70 wt %) of the thermoplastic resin to the amorphous polyether imide resin and the inevitable impurities is as follows. When the content of the amorphous polyether imide resin is less than 30 wt %, the crystallization ability of the whole composition increases and thus the lamination ability at the time of forming a multilayer deteriorates. When the content is greater than 75 wt %, the crystallization ability of the whole composition decreases and thus the heat resistance of the reflow deteriorates even at the crystal-fusing peak temperature of 260° C. or more.

An inorganic filler may be added to the thermoplastic resin.

The inorganic filler is not particularly limited, but may include any known filler. Examples thereof include talc, synthetic mica, mica, glass flake, boron nitride (BN), plate-like calcium carbonate, plate-like aluminum hydroxide, plate-like silica, and plate-like potassium titanate. They may be added alone or in combination of two or more. Specifically, flake-like inorganic fillers having an average particle diameter of 15 µm or less and an aspect ratio (particle diameter/thickness) of 30 or more are desirable because they can reduce the linear expansion coefficient ratio of the in-plane direction and the thickness direction and suppress the generation of cracks in the boards at the time of performing thermal shock cycle test.

The additive amount of the inorganic filler is preferably in the range of 20 parts by weight to 50 parts by weight with respect to 100 parts by weight of the thermoplastic resin. When the additive amount is greater than 50 parts by weight, dispersion failure of the inorganic filler occurs, thereby easily causing a non-uniform linear expansion coefficient or easily causing a reduction in strength. When the additive amount is less than 20 parts by weight, the effect of improvement of the dimension stability by reducing the linear expansion coefficient is poor and inner stress due to the difference in linear expansion coefficient, for example, between the insulating substrate 11 and the conductive pattern 12 occurs in the reflow process, thereby causing warping or twisting of the board.

Other resins or various additives other than the inorganic fillers, such as a stabilizer, UV absorber, light stabilizer, nucleus agent, coloring agent, lubricant agent, and fire retardant, may be suitably added to the thermoplastic resin so long as its nature is not affected.

As a method of adding various additives including the inorganic fillers, the following known methods (a) and (b) may be used.

(a) Method of preparing a master batch in which various additives with a high concentration (about 10 to 60 wt % as a representative content) are mixed into a substrate (base resin) of a crystalline polyaryl ketone resin and/or amorphous polyether imide resin having a crystal-fusing peak temperature of 260° C. or more, the master batch to be used at an adjusted concentration, and mechanically blending the mixture using a kneader or an extruder.

(b) Method of mechanically blending various additives directly into the resin using a kneader or an extruder.

Method (a) is preferable in view of dispersion ability or workability. The surface of the insulating substrate 21 may be suitably subjected to corona treatment in order to enhance the lamination ability.

Next, a method of manufacturing the multilayer printed circuit board according to this embodiment will be described with reference to FIGS. 2 to 4.

Methods of manufacturing the circuit boards 1 to 3 will be first described and then the method of manufacturing the multilayer printed circuit board using the circuit boards 1 to 3 will then be described.

(1) Circuit Board 1

Figure 2A:
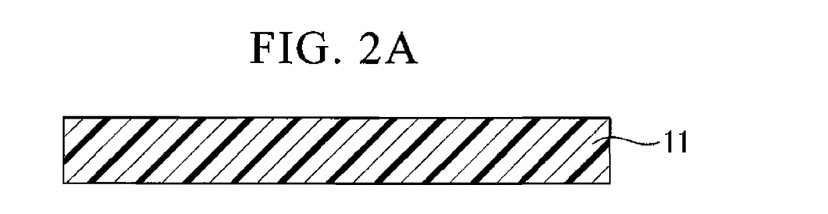
FIGS. 2A, 2B, 2C and 2D show sectional views illustrating a method of manufacturing the multilayer printed circuit board according to the first embodiment of the invention.

As shown in FIG. 2(*a*), an insulating substrate (prepreg) 11 in a semi-hardened state (B stage) in which a thermosetting resin is impregnated in glass cloth is prepared first.

Figure 2B:
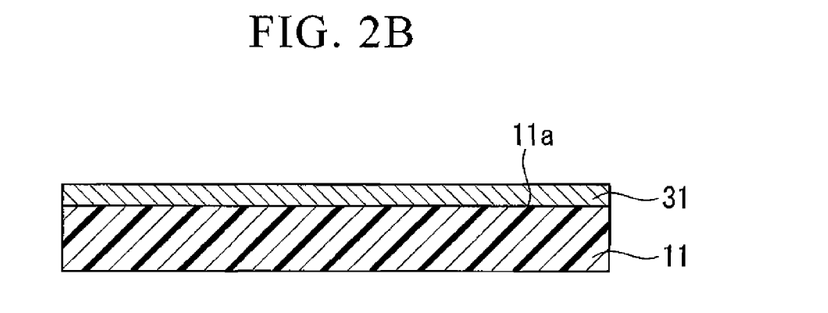

Then, as shown in FIG. 2(*b*), a copper (Cu) foil 31 is thermally compressed against a surface (main surface) 11*a* of the insulating substrate 11 and the insulating substrate 11 is completely hardened at the same time.

Figures 2C, 2D:
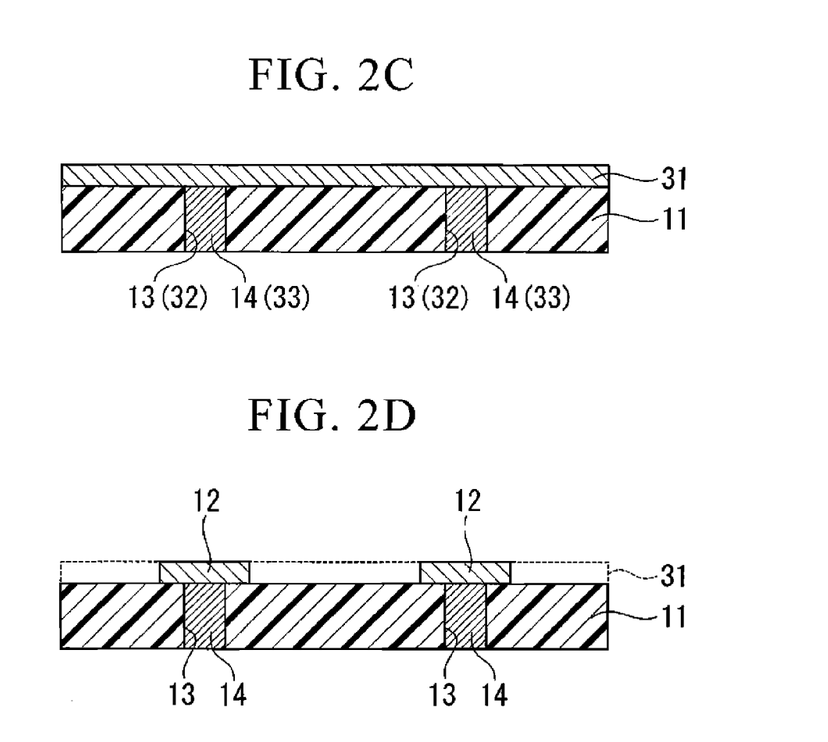

As shown in FIG. 2(*c*), through-holes 32 penetrating the insulating substrate 11 are formed at predetermined positions of the insulating substrate 11 using a laser beam or a mechanical drill, thereby forming the via-holes 13.

The via-holes 13 are filled with a conductive paste 33 using a screen printing method and then the conductive paste 33 is heated to volatilize the solvent of the paste and to dry and harden the conductive paste, thereby forming the via wires 14. At this time, the binder resin in the conductive paste 33 is not hardened yet.

The drying and hardening condition of the conductive paste 33 is atmospheric air at 125° C. for 45 minutes in the case of a resin-based press contact type conductive paste such as conductive paste containing 6 wt % of γ-butyrolactone (bp: 203° C.) as a solvent, and a mixture of 10 parts by weight of a binder resin, which is subjected to the hardening reaction (reaction peak temperature: 180° C.) in the addition reaction of methallyl compound/bismaleimide and 90 parts by weight of conductive particles which are flake-shaped Ag particles with an average particle diameter of 8 µm.

Dried and hardened products of the conductive paste 33 remaining on the surface of the insulating substrate 11 opposite to the copper (Cu) foil 31 are removed using mechanical polishing or the like.

As shown in FIG. 2(d), the copper (Cu) foil 31 is patterned by etching to form the conductive patterns 12.

In this way, the circuit board 1 can be manufactured.

The circuit board 2 can be manufactured in the same way as the circuit board 1.

(2) Circuit Board 3

Figure 3A:
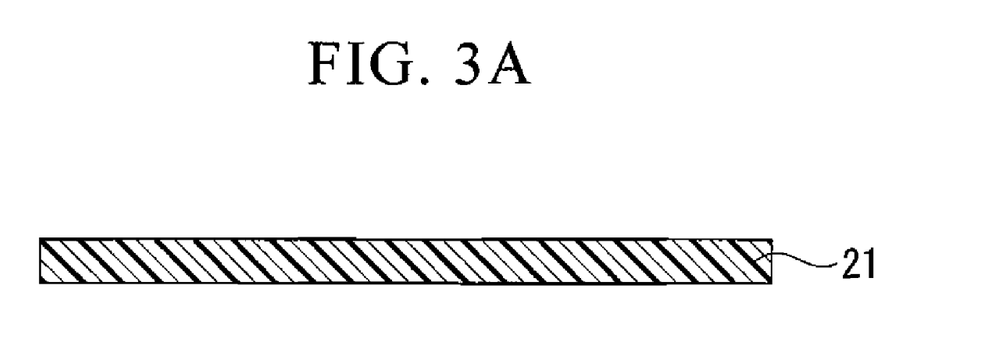
FIGS. 3A and 3B show sectional views illustrating the method of manufacturing the multilayer printed circuit board according to the first embodiment of the invention.

As shown in FIG. 3(a), the insulating substrate 21 containing a thermoplastic resin as a major component is prepared.

The insulating substrate 21 preferably has a film, thin plate, or sheet shape. As a shaping method thereof, known methods such as an extrusion cast method using a T die and a calendar method can be used. Although not particularly limited, the extrusion cast method using a T die is preferable in view of a sheet forming characteristic or stable productivity.

The shaping temperature in the extrusion cast method using a T die can be suitably adjusted depending on the flow characteristic or film forming characteristic of the resin to be used, and approximately is in the range of 360° C. to 400° C. in the case of a resin composition containing a crystalline polyaryl ketone resin and amorphous polyether imide resin having a crystal-fusing peak temperature of 260° C. or more. Further, since an amorphous film is formed by rapid cooling at the time of forming a film using the extrusion cast method and exhibits a region having a decreased elastic modulus in vicinity of 200° C. to 230° C., the thermal fusion is possible in the above temperature range.

Figure 3B:
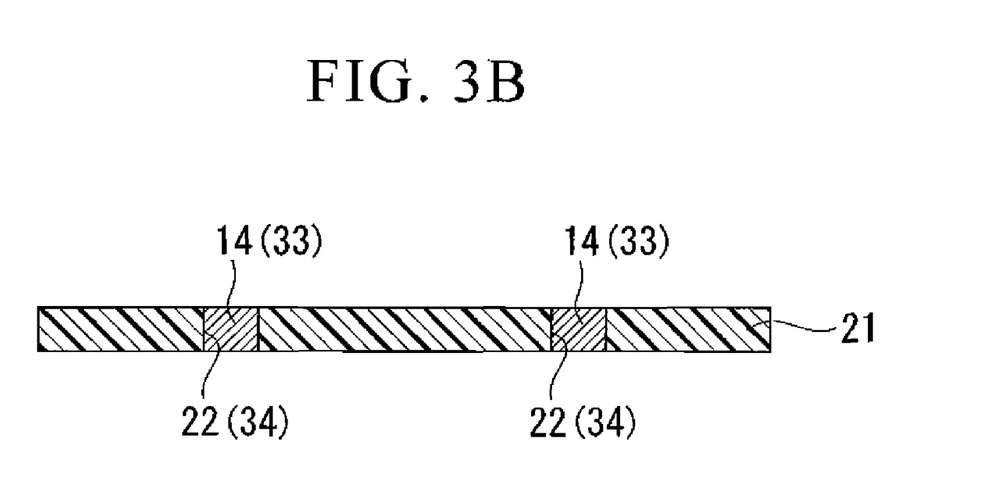

As shown in FIG. 3(b), through-holes 34 penetrating the insulating substrate 21 are formed at predetermined positions of the insulating substrate 21 using a laser beam or a mechanical drill, thereby forming via-holes 22.

The via-holes 22 are filled with the conductive paste 33 using a screen printing method and then the conductive paste 33 is heated, dried, and hardened, thereby forming the via wires 14.

A drying and hardening condition of the conductive paste 33 is to the same as the above-mentioned drying and hardening condition of the conductive paste 33.

The dried and hardened products of the conductive paste 33 remaining on the insulating substrate 21 are removed using mechanical polishing or the like.

In this way, the circuit board 3 can be manufactured.

(3) Multilayer Printed Circuit Board

Figure 4:
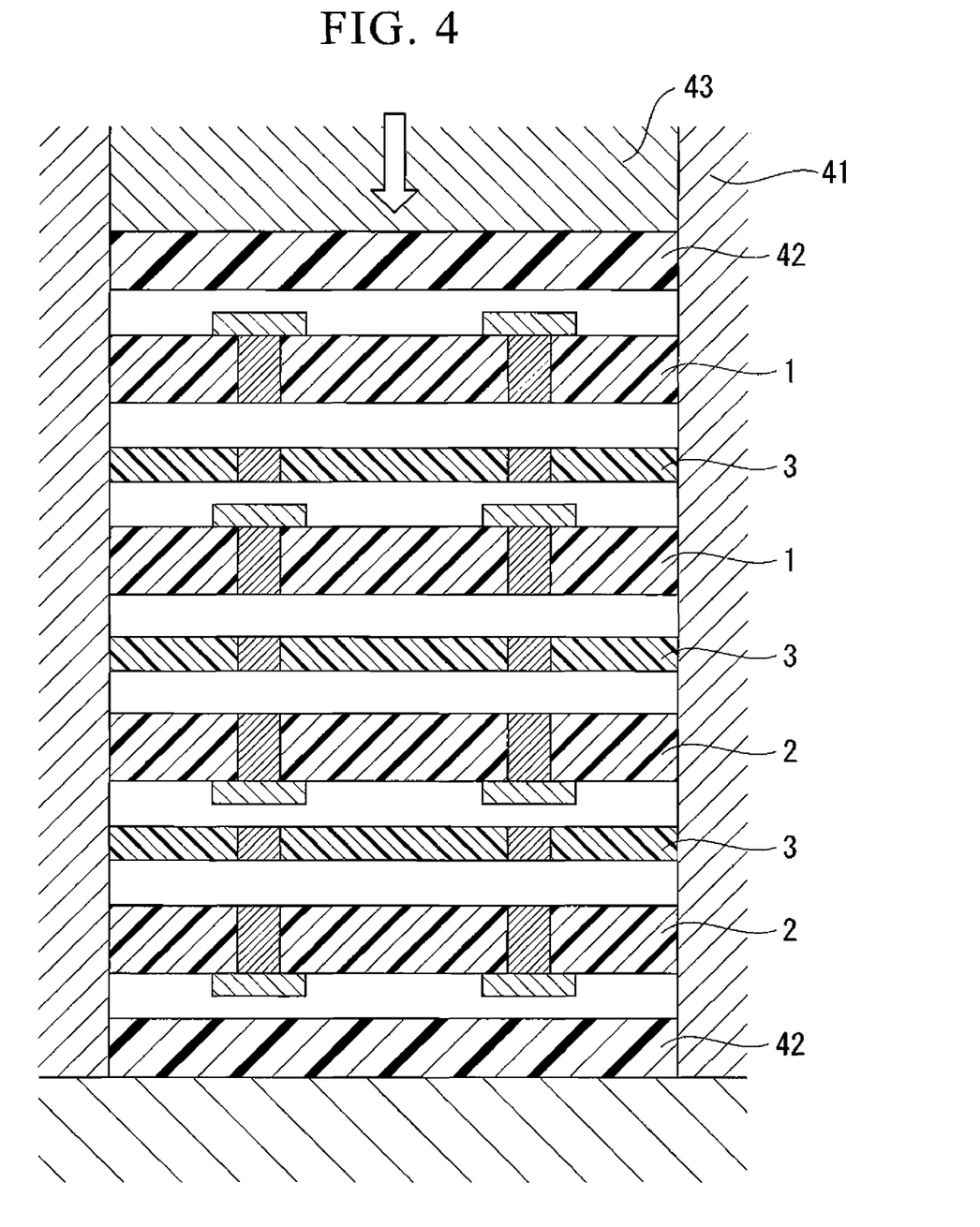
FIG. 4 shows sectional views illustrating the method of manufacturing the multilayer printed circuit board according to the first embodiment of the invention.

As shown in FIG. 4, a cushion film 42 having elasticity and release ability, the circuit board 2, the circuit board 3, the circuit board 2, the circuit board 3, the circuit board 1, the circuit board 3, the circuit board 1, and the cushion film 42 having elasticity and release ability are laid in this order from the downside in a laminating jig 41 having a built-in heater and the circuit boards 2 through 1 are thermally pressed by pressing the pressing jig 43, thereby thermally laminating the circuit boards 2 through 1 to form a integrated multilayer body.

The thermal pressing can be effectively performed at a temperature of no less than the glass transition temperature (Tg) of the thermoplastic resin constituting the insulating substrate 21, and less than the crystal fusing temperature (Tm) of the thermoplastic resin constituting the insulating substrate 21, and less than the pyrolysis temperature of the thermosetting resin constituting the circuit boards 1 and 2.

An example of the thermal pressing condition includes a maximum holding temperature of 210° C. to 260° C., a pressure of 30 to 70 kg/cm², and a holding time of 30 minutes when the composition of the thermoplastic resin includes 30 wt % to 70 wt % of a polyaryl ketone resin having a crystal-fusing peak temperature of 260° C. or more and the balance containing an amorphous polyether imide resin and inevitable impurities.

After the lamination in this condition, the insulating substrate 21 constituting the circuit board 3 is crystallized to exhibit solder heat-resistance. On the other hand, the conductive paste 33 is connected between the layers and completely hardened.

In this way, the multilayer printed circuit board according to this embodiment can be manufactured.

According to this embodiment, since the circuit boards 1 and 2 made of the insulating substrate 11 containing a thermosetting resin as a major component and the circuit board 3 made of the insulating substrate 21 containing a thermoplastic resin as a major component are laminated alternately, it is not necessary to dispose an adhesive layer or a cover layer. Accordingly, the heat resistance, the mechanical strength, and the electrical insulating characteristics can be enhanced and the dielectric constant can be decreased, thereby coping with high frequencies.

Since prepreg flowing at the time of lamination is not necessary, it is possible to cope with a small-diameter land and thus to realize a conductive wiring pattern with high precision and accuracy, and a decrease in diameter of a via land.

Since the surface mounting sections are formed of the circuit boards 1 and 2 containing a thermosetting resin as a major component, it is possible to provide a multilayer printed circuit board excellent in electrical characteristics and reliability by using the circuit boards 1 and 2 having high performance at the time of packaging.

Second Embodiment

Figure 5:
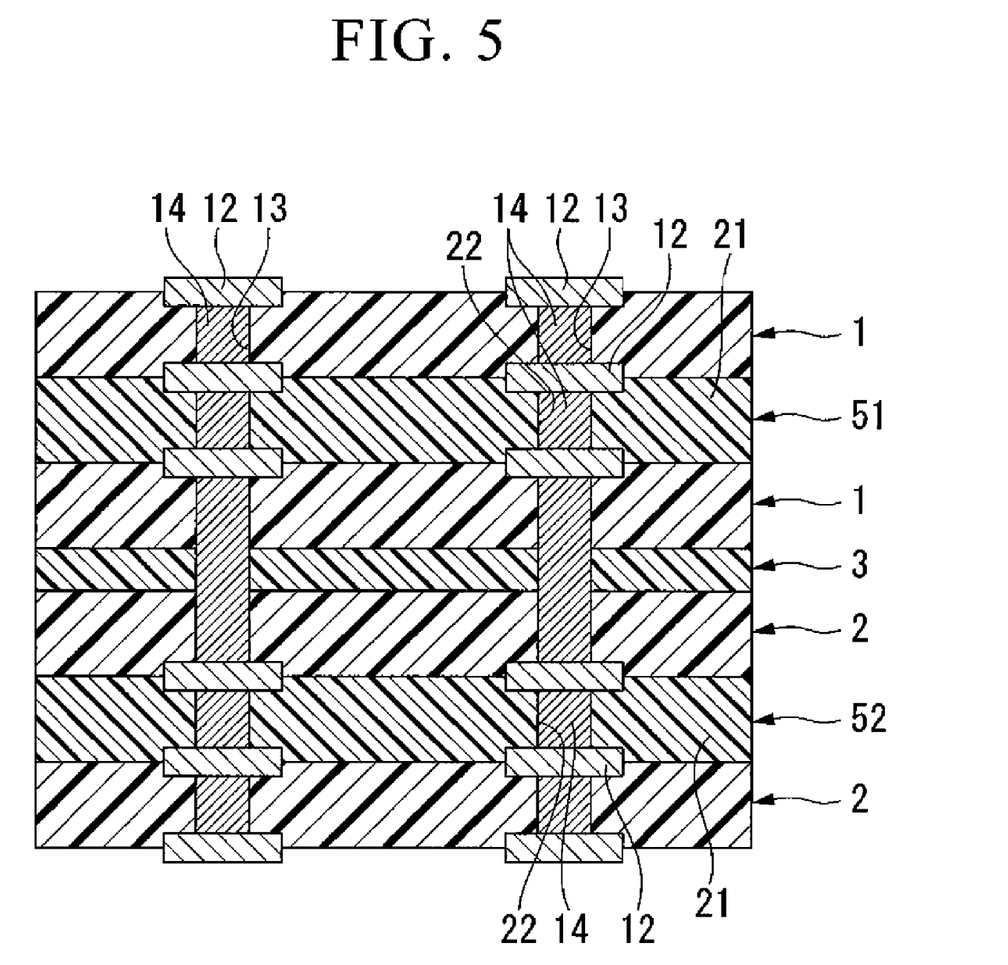
FIG. 5 is a cross-sectional view illustrating a multilayer printed circuit board according to a second embodiment of the invention.

FIG. 5 is a cross-sectional view illustrating a multilayer printed circuit board according to a second embodiment of the invention. The multilayer printed circuit board according to the second embodiment is different from the multilayer printed circuit board according to the first embodiment in the following points. That is, in the circuit board 3 according to the first embodiment, only the via wires 14 are formed in the insulating substrate 21 containing the thermoplastic resin with a thickness of 100 μm or less as a major component. However, in a (second) circuit board 51 according to this embodiment, a plurality of via-holes 22 are formed in the insulating substrate 21 containing a thermoplastic resin with a thickness of 50 to 200 μm as a major component, via wires 14 are formed in the via-holes 22 and 22, and a conductive pattern 12 made of copper (Cu) foil with a thickness of 35 μm or less is formed on the insulating substrate 21. A (second) circuit board 52 is different from the circuit board 51 only in that the conductive pattern 12 is formed on the bottom surface of the insulating substrate 21.

A method of manufacturing the multilayer printed circuit board according to this embodiment will be described with reference to FIGS. 6 and 7.

The methods of manufacturing the circuit boards 1 to 3 are as described in the first embodiment.

The method of manufacturing the circuit boards 51 and 52 will be first described and the method of manufacturing the multilayer printed circuit board employing the circuit boards 1 to 3, 51, and 52 will then be described.

(1) Circuit Board 51

Figure 6A:
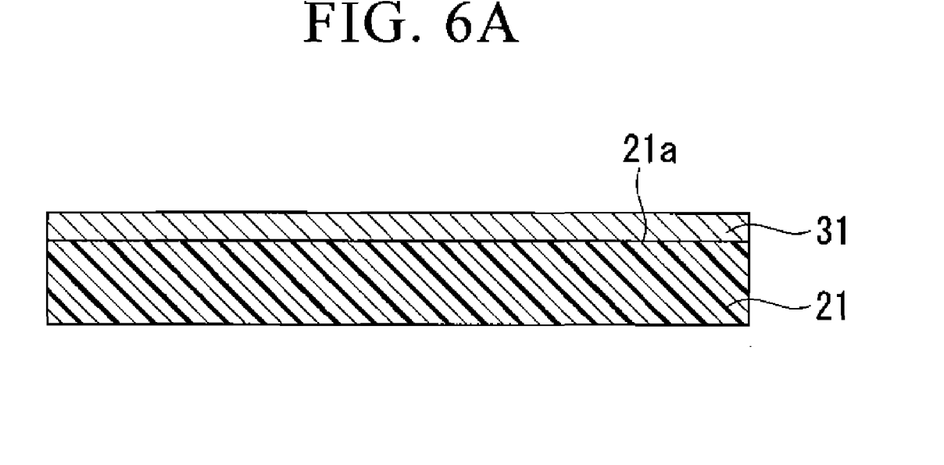
FIGS. 6A, 6B and 6C show sectional views illustrating a method of manufacturing the multilayer printed circuit board according to the second embodiment of the invention.

As shown in FIG. 6(*a*), an insulating substrate 21 containing a thermoplastic resin as a major component is prepared.

The insulating substrate 21 preferably has a film, thin plate, or sheet shape with a thickness of 50 to 200 μm. As a shaping method thereof, known methods such as an extrusion cast method using a T die and a calendar method can be used. Although not particularly limited, the extrusion cast method using a T die is preferable in view of sheet forming characteristics or stable productivity.

The shaping temperature in the extrusion cast method using a T die can be suitably adjusted depending on flow characteristics or a film forming characteristics of the resin to be used, and is in the range of 360° C. to 400° C. in the case of a resin composition containing a crystalline polyaryl ketone resin and amorphous polyether imide resin having a crystal-fusing peak temperature of 260° C. or more.

A copper (Cu) foil 31 is bonded to the surface (main surface) 21*a* of the insulating substrate 21.

A method of laminating the copper (Cu) foil at the time of forming a sheet using a T die is used in the bonding.

Figure 6B:
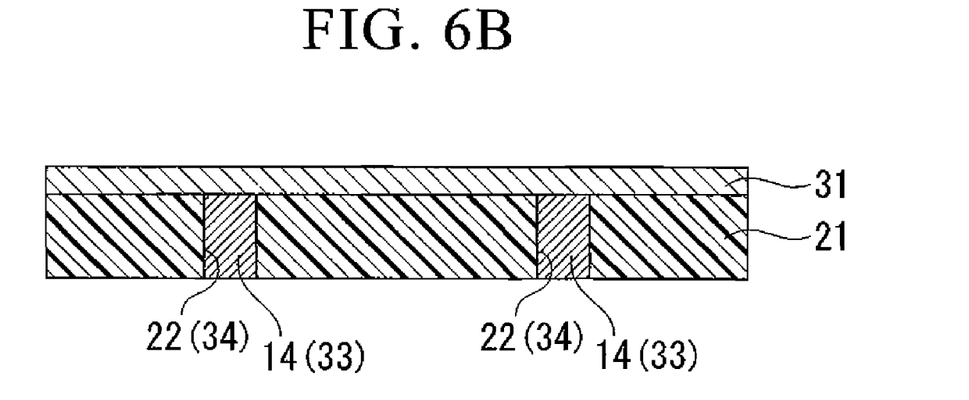

As shown in FIG. 6(*b*), the through-holes 34 penetrating the insulating substrate 21 are formed at predetermined positions of the insulating substrate 21 using a laser beam or mechanical drill, thereby forming the via-holes 22.

The via-holes 22 are filled with the conductive paste 33 using a screen printing method and then the conductive paste 33 is heated, dried, and hardened, thereby forming the via wires 14. The drying and hardening condition of the conductive paste 33 is the same as the first embodiment.

The dried and hardened products of the conductive paste 33 remaining on the surface of the insulating substrate 21 opposite to the copper (Cu) foil 31 are removed using mechanical polishing or the like.

Figure 6C:
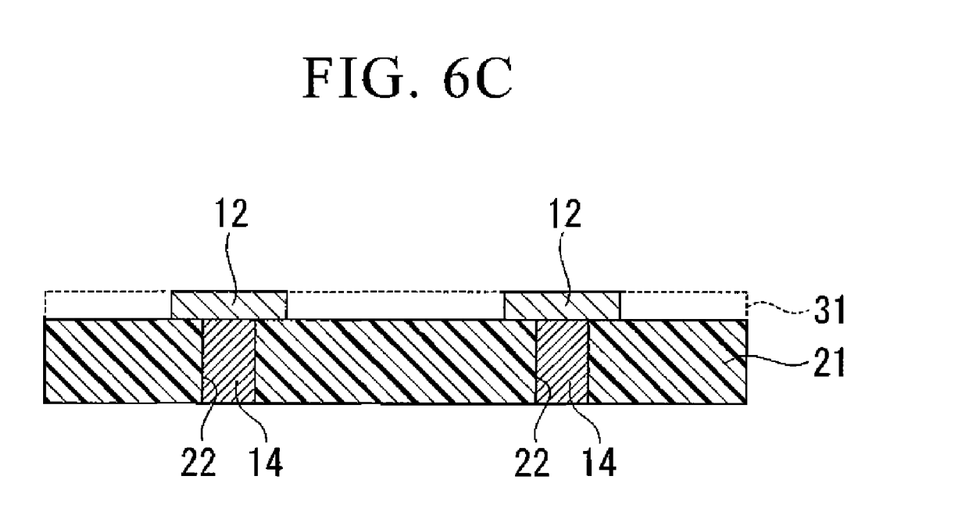

As shown in FIG. 6(*c*), the copper (Cu) foil 31 is patterned by etching to form the conductive pattern 12.

In this way, the circuit board 51 can be manufactured.

Except for the conductive pattern 12 being formed on the bottom surface of the insulating substrate 21, the circuit board 52 can be manufactured in the same way as the circuit board 51.

(2) Multilayer Printed Circuit Board

Figure 7:
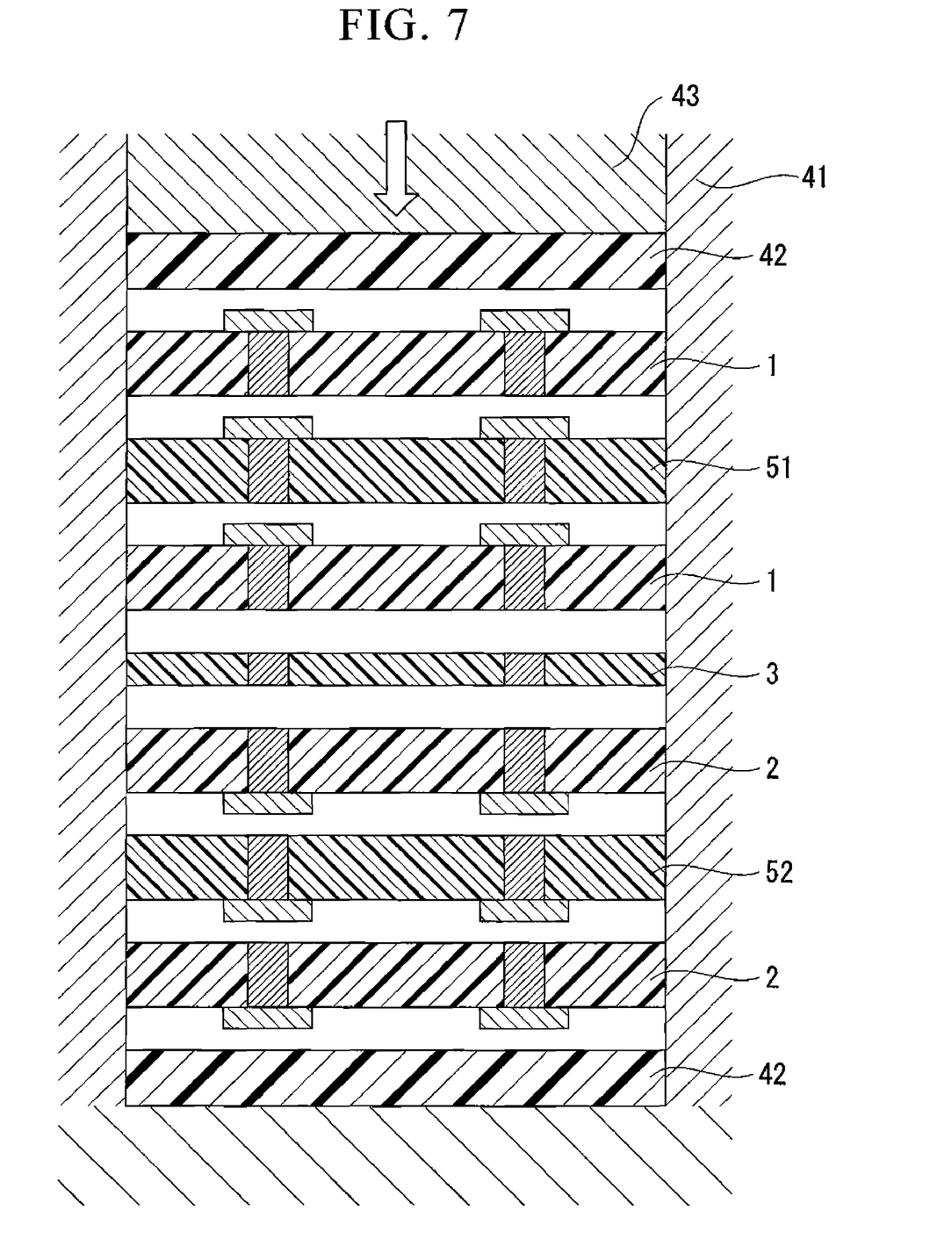
FIG. 7 shows sectional views illustrating the method of manufacturing the multilayer printed circuit board according to the second embodiment of the invention.

As shown in FIG. 7, the cushion film 42 having elasticity and release ability, the circuit board 2, the circuit board 52, the circuit board 2, the circuit board 3, the circuit board 1, the circuit board 51, the circuit board 1, and the cushion film 42 having elasticity and release ability are laid in this order from the downside in the laminating jig 41 having a built-in heater and the circuit boards 2 through 1 are thermally pressed by pressing the pressing jig 43, thereby laminating the circuit boards 2 through 1 to form a multilayer body.

In this case, the thermal pressing condition is to the same as the thermal pressing condition of the first embodiment.

In this way, the multilayer printed circuit board according to this embodiment can be manufactured.

In this embodiment, it is possible to obtain the same operations and advantages as the multilayer printed circuit board according to the first embodiment.

In the circuit boards 51 and 52, since the conductive pattern 12 made of a copper (Cu) foil is formed on the top surface (or the bottom surface) of the insulating substrate 21, it is possible to enhance the degree of freedom in wiring and thus to cope with various wiring patterns.

Third Embodiment

Figure 8:
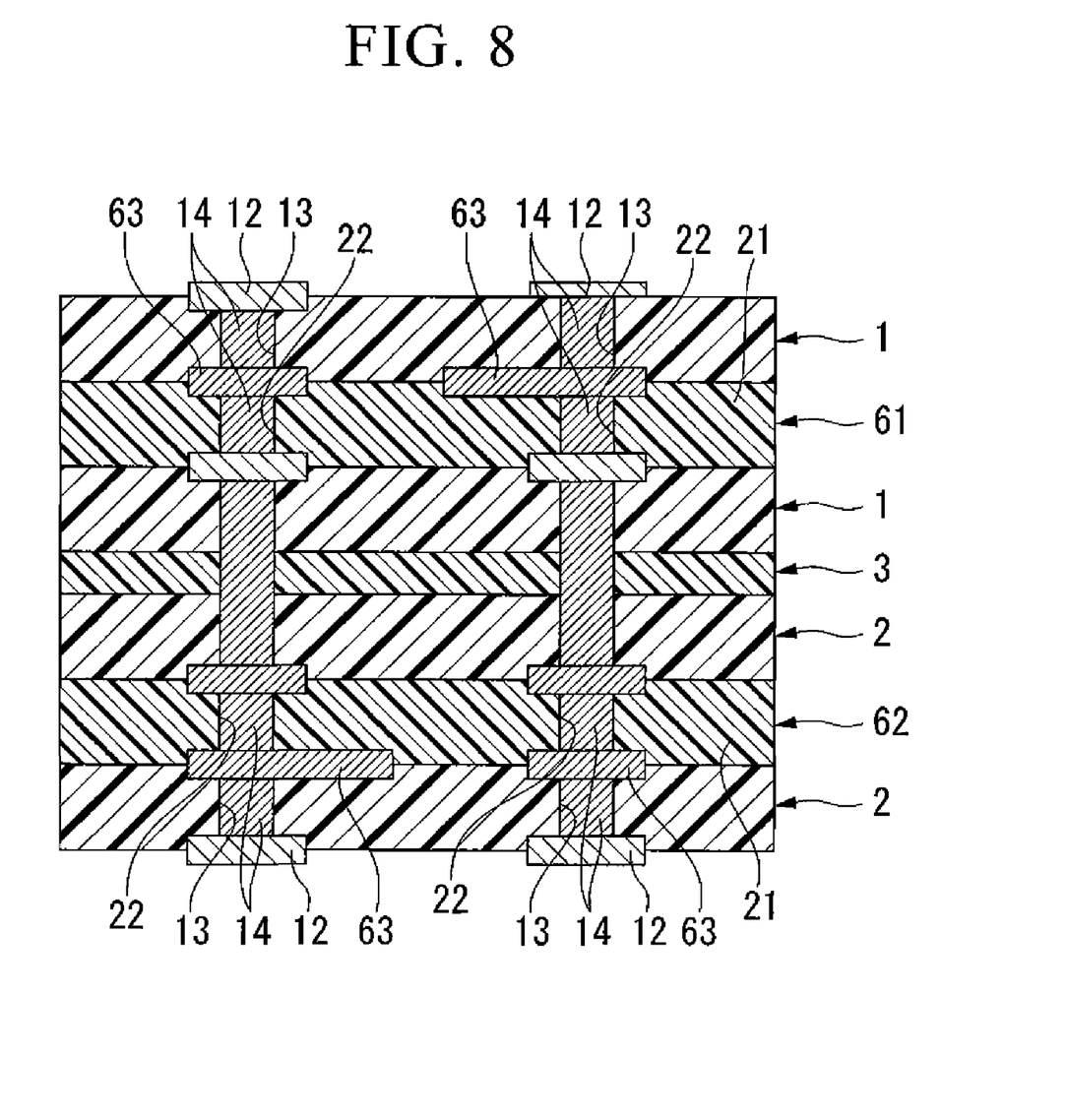
FIG. 8 is a cross-sectional view illustrating a multilayer printed circuit board according to a third embodiment of the invention.

FIG. 8 is a cross-sectional view illustrating a multilayer printed circuit board according to a third embodiment of the invention. The multilayer printed circuit board according to the third embodiment is different from the multilayer printed circuit board according to the second embodiment in the following points. That is, in the (second) circuit boards 51 and 52 according to the second embodiment, the conductive pattern 12 made of a copper (Cu) foil is formed on the top surface (or the bottom surface) of the insulating substrate 21. However, in a (second) circuit board 61 according to this embodiment, a conductive pattern 63 is formed by applying conductive paste on the top surface of the insulating substrate using a screen printing method and then drying and hardening the conductive paste. A (second) circuit board 62 is to the same as the circuit board 61, except for a conductive pattern 63 being formed on the bottom surface of the insulating substrate 21.

A method of manufacturing the multilayer printed circuit board according to this embodiment will be described with reference to FIGS. 9 and 10.

The methods of manufacturing the circuit boards 1 to 3 are described in the first embodiment.

The method of manufacturing the circuit boards 61 and 62 will be first described and the method of manufacturing the multilayer printed circuit board employing the circuit boards 1 to 3, 61, and 62 will then be described.

(1) Circuit Board 61

Figure 9A:
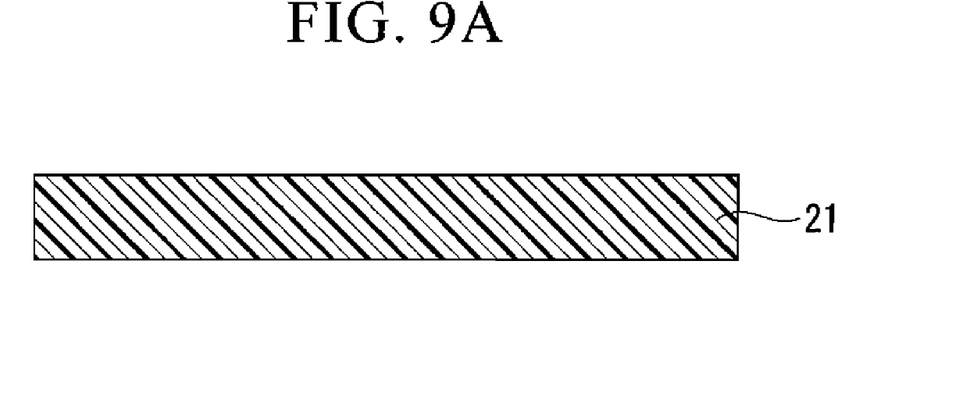
FIGS. 9A, 9B and 9C show sectional views illustrating a method of manufacturing the multilayer printed circuit board according to the third embodiment of the invention.

As shown in FIG. 9(*a*), the insulating substrate 21 containing a thermoplastic resin as a major component is prepared.

The insulating substrate 21 preferably has a film, thin plate, or sheet shape with a thickness of 50 to 200 μm. As a shaping method thereof, known methods such as an extrusion cast method using a T die and a calendar method can be used. Although not particularly limited, the extrusion cast method using a T die is desirable in view of sheet forming characteristics or stable productivity. The shaping temperature of the extrusion cast method is to the same as the shaping temperature of the second embodiment.

Figure 9B:
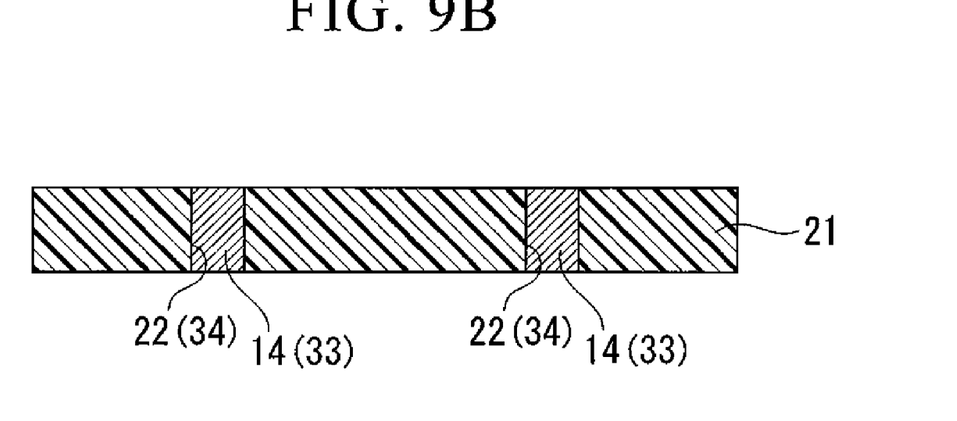

As shown in FIG. 9(*b*), the through-holes 34 penetrating the insulating substrate 21 are formed at predetermined positions of the insulating substrate 21 using a laser beam or a mechanical drill, thereby forming the via-holes 22.

The via-holes 22 are filled with the conductive paste 33 using a screen printing method and then the conductive paste 33 is heated, dried, and hardened, thereby forming the via wires 14. The drying and hardening condition of the conductive paste 33 is the same as the first embodiment.

The dried and hardened products of the conductive paste 33 remaining on the insulating substrate 21 are removed using mechanical polishing or the like.

Figure 9C:
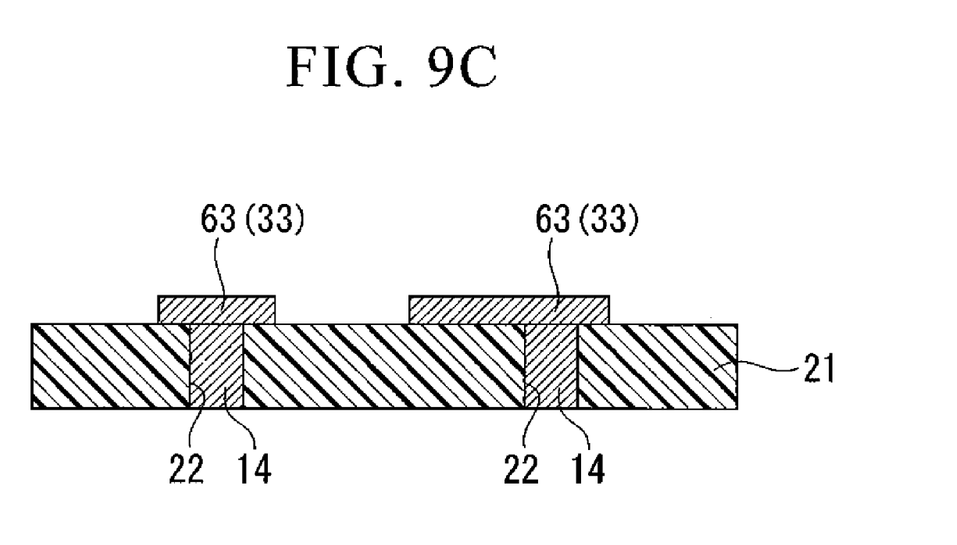

As shown in FIG. 9(*c*), the predetermined conductive pattern 63 is formed by applying the conductive paste 33 to the insulating substrate 21 using a screen printing method and then heating, drying, and hardening the conductive paste 33. The drying and hardening condition of the conductive paste 33 is the same as the first embodiment.

In this way, the circuit board 61 can be manufactured.

Except for the conductive pattern 63 being formed on the bottom surface of the insulating substrate 21, the circuit board 62 can be manufactured in the same way as the circuit board 61.

(2) Multilayer Printed Circuit Board

Figure 10:
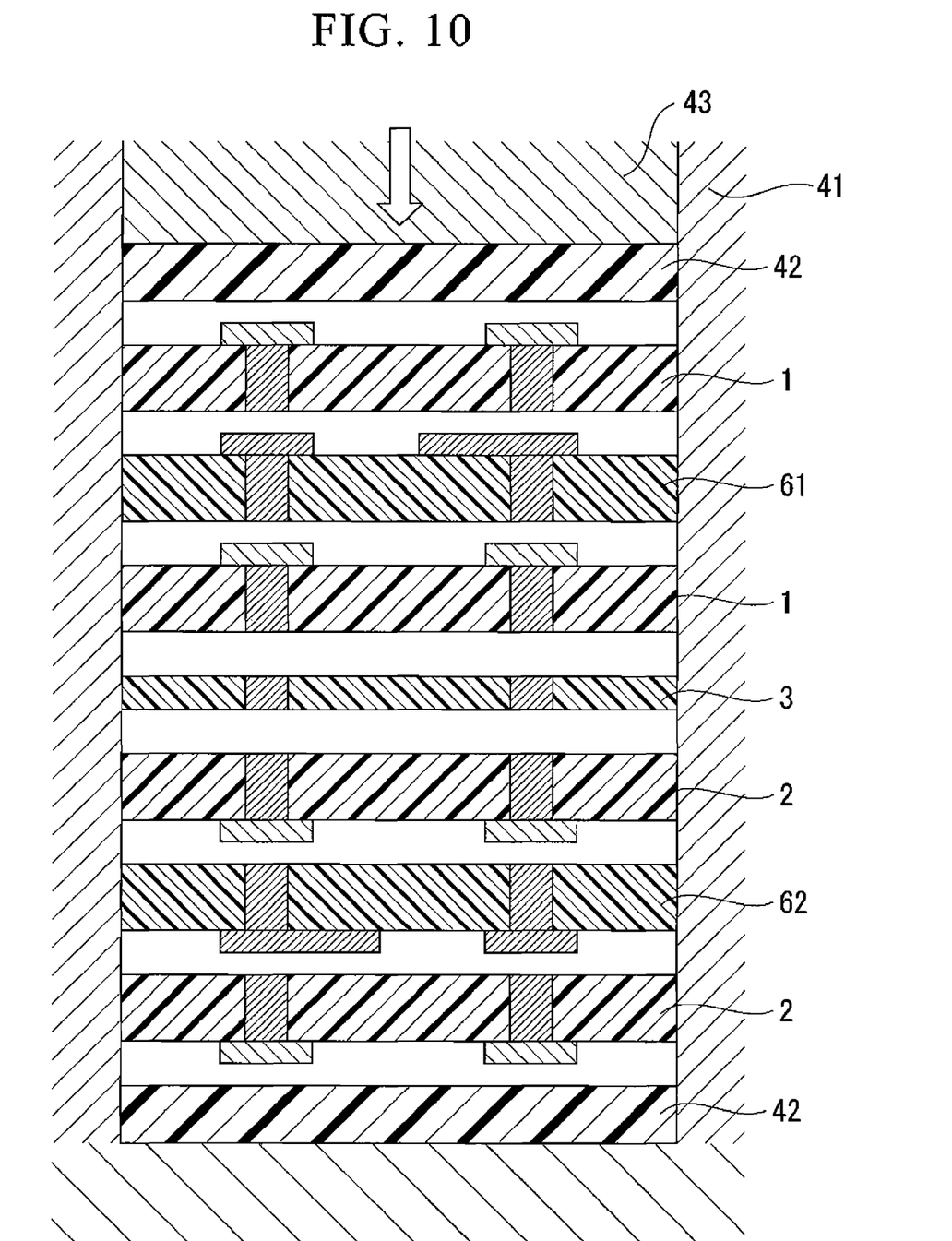
FIG. 10 shows sectional views illustrating the method of manufacturing the multilayer printed circuit board according to the third embodiment of the invention.

As shown in FIG. 10, the cushion film 42 having elasticity and release ability, the circuit board 2, the circuit board 62, the circuit board 2, the circuit board 3, the circuit board 1, the circuit board 61, the circuit board 1, and the cushion film 42 having elasticity and release ability are laid in this order from the downside in the laminating jig 41 having a built-in heater and the circuit boards 2 through 1 are thermally pressed by pressing the pressing jig 43, thereby laminating the circuit boards 2 through 1 to form a multilayer body.

In this case, the thermal pressing condition is exactly the same as the thermal pressing condition of the first embodiment.

In this way, the multilayer printed circuit board according to this embodiment can be manufactured.

In this embodiment, it is possible to obtain the same operations and advantages as the multilayer printed circuit board according to the first embodiment.

In the circuit boards 61 and 62, since the conductive pattern 63 formed by drying and hardening the conductive paste 33 is formed on the top surface (or the bottom surface) of the insulating substrate 21, it is possible to enhance the degree of freedom in wiring and thus to cope with various wiring patterns.

INDUSTRIAL APPLICABILITY

Since the multilayer printed circuit board according to the invention is a multilayer body in which the circuit board containing the thermosetting resin as a major component and the circuit board containing the thermoplastic resin coexist, it can be effectively applied to various circuit boards such as typical multilayer printed circuit boards, multilayer circuit boards having electronic parts such as chip-shaped ICs built in a thermoplastic resin substrate, and multilayer circuit boards having electronic parts such as chip-shaped ICs mounted thereon.

The invention claimed is:

1. A multilayer printed circuit board, comprising:
    plural first circuit boards formed of a first insulating substrate comprising a thermosetting resin as a major component;
    and one or more second circuit boards formed of a second insulating substrate comprising a thermoplastic resin as a major component,
    wherein:
        the first and second circuit boards form a multilayer body;
        the second circuit board includes
            a circuit board in which a conductive pattern is formed on at least one surface of the second insulating substrate and an interlayer wire penetrating the second insulating substrate in the thickness direction is formed in the second insulating substrate;
            the interlayer wire is formed of conductive paste; and
        the circuit boards at both ends of the multilayer body in a lamination direction are formed of the first circuit board.

2. The multilayer printed circuit board according to claim 1, wherein the first circuit board is configured so that a conductive pattern is formed on at least one surface of the first insulating substrate, and
    further comprising an interlayer wire penetrating the first insulating substrate in the thickness direction is formed in the first insulating substrate.

3. The multilayer printed circuit board according to claim 1, wherein the thermosetting resin comprises as a major component one selected from the group consisting of an epoxy resin, bismaleimide/triazine resin and allylic polyphenylene ether resin.

4. The multilayer printed circuit board according to claim 1, wherein the thermoplastic resin comprises a crystalline polyaryl ketone resin and amorphous polyether imide resin having a crystal-fusing peak temperature of 260° C. or more.

5. The multilayer printed circuit board according to claim 1, wherein the thermosetting resin comprises as a major component one selected from the group consisting of epoxy resin, bismaleimide/triazine resin, and allylic polyphenylene ether resin and the thermoplastic resin contains a crystalline polyaryl ketone resin and amorphous polyether imide resin having a crystal-fusing peak temperature of 260° C. or more.

6. The multilayer printed circuit board according to claim 4, wherein the content of the crystalline polyaryl ketone resin is in the range of 30 wt % to 70 wt % and the balance comprises the amorphous polyether imide resin and inevitable impurities.

7. The multilayer printed circuit board according to claim 4, wherein the crystalline polyaryl ketone resin is a polyetherether ketone resin.

8. The multilayer printed circuit board according to claim 1, wherein the second circuit board includes both a circuit board in which a conductive pattern is formed on at least one surface of the second insulating substrate and an interlayer wire penetrating the second insulating substrate in the thickness direction is formed in the second insulating substrate, and a circuit board in which only an interlayer wire penetrating the second insulating substrate in the thickness direction is formed in the second insulating substrate.

* * * * *